(12) United States Patent
He et al.

(10) Patent No.: US 12,326,786 B2
(45) Date of Patent: Jun. 10, 2025

(54) INCREMENTAL BACKUP METHOD AND SYSTEM FOR CAD ENGINEERING DATA FILE

(71) Applicant: University of Science and Technology Beijing, Beijing (CN)

(72) Inventors: Ketai He, Beijing (CN); Xiaowei Meng, Beijing (CN); Yanxi Li, Beijing (CN); Dongmei Zhu, Beijing (CN); Cheng Zhao, Beijing (CN)

(73) Assignee: University of Science and Technology Beijing China, Beijing (CN)

( * ) Notice: Subject to any disclaimer, the term of this patent is extended or adjusted under 35 U.S.C. 154(b) by 0 days.

(21) Appl. No.: 18/305,465

(22) Filed: Apr. 24, 2023

(65) Prior Publication Data
US 2023/0342256 A1     Oct. 26, 2023

(30) Foreign Application Priority Data

Apr. 24, 2022   (CN) .......................... 202210432840.X

(51) Int. Cl.
*G06F 11/14*     (2006.01)
*G06F 30/10*     (2020.01)

(52) U.S. Cl.
CPC .......... *G06F 11/1451* (2013.01); *G06F 30/10* (2020.01)

(58) Field of Classification Search
CPC ... G06F 11/1451; G06F 30/10; G06F 11/1458
See application file for complete search history.

(56) References Cited

U.S. PATENT DOCUMENTS

| | | | |
|---|---|---|---|
| 2009/0228680 A1* | 9/2009 | Reddy | G06F 11/1453 711/216 |
| 2014/0095439 A1* | 4/2014 | Ram | G06F 3/067 707/640 |
| 2019/0205244 A1* | 7/2019 | Smith | G06F 3/065 |
| 2021/0073033 A1* | 3/2021 | Gaonkar | G06F 9/5016 |
| 2022/0066456 A1* | 3/2022 | Ebrahimi Afrouzi | G06F 3/04883 |
| 2022/0269601 A1* | 8/2022 | Monteith | G06F 3/0643 |
| 2023/0106552 A1* | 4/2023 | Cohee | G06F 30/12 703/6 |

* cited by examiner

*Primary Examiner* — Merilyn P Nguyen
(74) *Attorney, Agent, or Firm* — Reising Ethington, P.C.

(57) ABSTRACT

The present disclosure relates to an incremental backup method and system for a CAD engineering data file, and the method includes: chunking historical CAD engineering data based on a sliding window approach, to determine a first data block group; calculating a first hash fingerprint value separately for each data block in the first data block group; chunking, based on the sliding window approach, CAD engineering data to be backed up, to determine a second data block group; calculating a second hash fingerprint value separately for each data block in the second data block group; and determining a backup status of the data block in the second data block group based on the first hash fingerprint value and the second hash fingerprint value. The present disclosure resolves a problem that a long time is occupied when a large-scale engineering CAD data file is saved by applying a full backup.

3 Claims, 2 Drawing Sheets

INCREMENTAL BACKUP METHOD AND SYSTEM FOR CAD ENGINEERING DATA FILE

CROSS REFERENCE TO RELATED APPLICATION

This patent application claims the benefit and priority of Chinese Patent Application No. 202210432840.X, filed with the China National Intellectual Property Administration on Apr. 24, 2022, the disclosure of which is incorporated by reference herein in its entirety as part of the present application.

TECHNICAL FIELD

The present disclosure relates to the field of computer file storage technologies, and in particular, to an incremental backup method and system for a computer aided design (CAD) engineering data file.

BACKGROUND

Development of a computer aided design (CAD) technology greatly shortens a design cycle and a design cost of an engineering product, bringing great convenience to an industrial field. In the automotive, aerospace and other industries, a CAD product is often used to process a large-scale assembly model file with a large quantity of parts, and a large part model file with a large quantity of features and complex structures. Processing of these large-scale engineering data files poses a great challenge to the CAD technology, which includes a backup of the engineering data files. In an actual product design process, changes are often made to an original design model, which means that a part of an engineering data file is modified. When a full backup is performed, computer resources are taken up, time is consumed, and engineering efficiency is affected.

SUMMARY

A purpose of the present disclosure is to provide an incremental backup method and system for a CAD engineering data file, to resolve a problem that a long time is occupied when a large-scale engineering CAD data file is saved by applying a full backup.

To achieve the above objective, the present disclosure provides the following solutions:

An incremental backup method for a CAD engineering data file provided in the present disclosure includes:
  chunking historical CAD engineering data based on a sliding window approach, to determine a first data block group;
  calculating a first hash fingerprint value separately for each data block in the first data block group, where the first hash fingerprint value includes a first MD5 value and a first Alder32 value;
  chunking, based on the sliding window approach, CAD engineering data to be backed up, to determine a second data block group;
  calculating a second hash fingerprint value separately for each data block in the second data block group, where the second hash fingerprint value includes a second MD5 value and a second Alder32 value; and
  determining a backup status of the data block in the second data block group based on the first hash fingerprint value and the second hash fingerprint value, where the backup status of the data block in the second data block group includes performing a backup on the data block in the second data block group and performing no backup on the data block in the second data block group.

Optionally, the chunking historical CAD engineering data based on a sliding window approach, to determine a first data block group specifically includes:
  determining a width w of a sliding window based on an idea of content-defined chunking;
  traversing the historical CAD engineering data through the sliding window of the width w, and calculating a plurality of first fingerprint values, where the first fingerprint value is a fingerprint value of the historical CAD engineering data corresponding to each sliding window;
  when the first fingerprint value satisfies a first setting condition, determining the historical CAD engineering data corresponding to the first fingerprint value as a first data block, where the first setting condition is f mod D=r, f is the first fingerprint value, D and r are both predetermined values, and r<D; and
  determining a plurality of first data blocks as the first data block group.

Optionally, the determining a backup status of the data block in the second data block group based on the first hash fingerprint value and the second hash fingerprint value specifically includes:
  determining whether the first Alder32 value is equal to the second Alder32 value, to obtain a first result;
  if the first result indicates that the first Alder32 value is not equal to the second Alder32 value, performing a backup on the data block in the second data block group corresponding to the second Alder32 value;
  if the first result indicates that the first Alder32 value is equal to the second Alder32 value, determining whether the first MD5 value is equal to the second MD5 value, to obtain a second result;
  if the second result indicates that the first MD5 value is not equal to the second MD5 value, performing a backup on the data block in the second data block group corresponding to the second MD5 value; and
  if the second result indicates that the first MD5 value is equal to the second MD5 value, performing no backup on the data block in the second data block group.

Optionally, the width w of the sliding window is determined based on a storage structure of CAD engineering data.

To achieve the above objective, the present disclosure further provides the following technical solution:

An incremental backup system for a CAD engineering data file provided in the present disclosure includes:
  a block division module for historical data, configured to chunk historical CAD engineering data based on a sliding window approach, to determine a first data block group;
  a first hash calculation module, configured to calculate a first hash fingerprint value separately for each data block in the first data block group, where the first hash fingerprint value includes a first MD5 value and a first Alder32 value;
  a block division module for data to be backed up, configured to chunk, based on the sliding window approach, CAD engineering data to be backed up, to determine a second data block group;
  a second hash calculation module, configured to calculate a second hash fingerprint value separately for each data block in the second data block group, where the second hash fingerprint value includes a second MD5 value and a second Alder32 value; and a backup status determining module, configured to determine a backup status of the data block in the second data block group based on the first hash fingerprint value and the second hash fingerprint value, where the backup status of the data block in the second data block group comprises performing a backup on the data block in the second data block group and performing no backup on the data block in the second data block group.

Optionally, the block division module for historical data specifically includes:

a sliding window determining submodule, configured to determine a width w of a sliding window based on an idea of content-defined chunking;

a fingerprint value calculation submodule, configured to: traverse the historical CAD engineering data through the sliding window of the width w, and calculate a plurality of first fingerprint values, where the first fingerprint value is a fingerprint value of the historical CAD engineering data corresponding to each sliding window;

a block division submodule, configured to: when the first fingerprint value satisfies a first setting condition, determine the historical CAD engineering data corresponding to the first fingerprint value as a first data block, where the first setting condition is f mod D=r, f is the first fingerprint value, D and r are both predetermined values, and r<D; and a data group submodule, configured to determine a plurality of first data blocks as the first data block group.

Optionally, the backup status determining module specifically includes:

a first determining submodule, configured to determine whether the first Alder32 value is equal to the second Alder32 value, to obtain a first result;

a first backup submodule, configured to: when the first result indicates that the first Alder32 value is not equal to the second Alder32 value, perform a backup on the data block in the second data block group corresponding to the second Alder32 value;

a second determining submodule, configured to: when the first result indicates that the first Alder32 value is equal to the second Alder32 value, determine whether the first MD5 value is equal to the second MD5 value, to obtain a second result;

a second backup submodule, configured to: when the second result indicates that the first MD5 value is not equal to the second MD5 value, perform a backup on the data block in the second data block group corresponding to the second MD5 value; and a third backup submodule, configured to: when the second result indicates that the first MD5 value is equal to the second MD5 value, perform no backup on the data block in the second data block group.

Optionally, the sliding window determining submodule further includes:

a window width setting unit, configured to determine the width w of the sliding window based on a storage structure of CAD engineering data.

According to specific embodiments provided by the present disclosure, the present disclosure provides the following technical effects:

The present disclosure provides an incremental backup method and system for a CAD engineering data file. Historical CAD engineering data is chunked based on a sliding window approach, to determine a first data block group and a second data block group. A first hash fingerprint value is separately calculated for each data block in the first data block group. A second hash fingerprint value is separately calculated for each data block in the second data block group. A backup status of the data block in the second data block group is determined based on the first hash fingerprint value and the second hash fingerprint value. Then, a selective backup of the waiting for backup CAD engineering data is performed, thereby reducing a data transmission amount and improving a processing capability of a CAD product for a large-scale engineering data file.

BRIEF DESCRIPTION OF THE DRAWINGS

To describe technical solutions in embodiments of the present disclosure or in the conventional technology more clearly, accompanying drawings required in the embodiments are briefly described below. Apparently, the accompanying drawings in the following description show only some embodiments of the present disclosure, and other drawings can be derived from these accompanying drawings by a person of ordinary skills in the art without creative efforts.

DETAILED DESCRIPTION OF THE EMBODIMENTS

The technical solutions of the embodiments of the present disclosure are clearly and completely described below with reference to the drawings. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

A purpose of the present disclosure is to provide an incremental backup method and system for a CAD engineering data file, which retains and optimizes, based on a content-defined chunking (CDC) idea, a strong and weak hash fingerprint matching mechanism of a traditional incremental backup algorithm (Rsync) while taking advantages of an CDC algorithm in dynamically defining data block boundaries and identifying duplicate data, and implements a fast and low redundancy incremental backup of a large-scale model engineering data file on a basis of enhanced byte-shifting problem resistance (CDC) and reduced fingerprint comparison overheads.

To make the above-mentioned objective, features, and advantages of the present disclosure clearer and more comprehensible, the present disclosure will be further described in detail below in conjunction with the accompanying drawings and specific examples.

Embodiment 1

Figure 1:
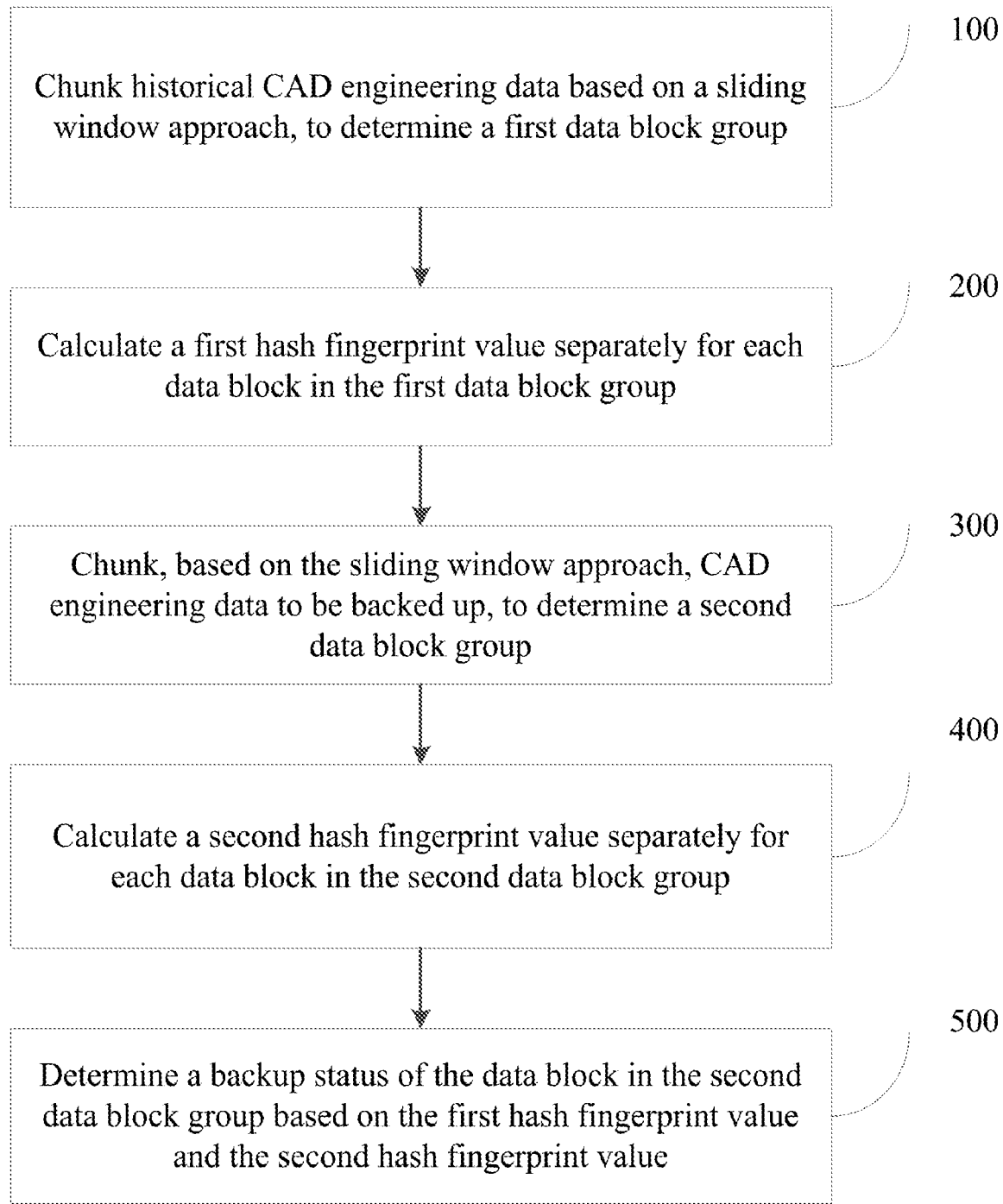
FIG. 1 is a schematic flowchart of an incremental backup method for a CAD engineering data file according to the present disclosure.

As shown in FIG. 1, an embodiment provides an incremental backup method for a CAD engineering data file, including the following steps.

Step 100: Chunk historical CAD engineering data based on a sliding window approach, to determine a first data block group.

Step 200: Calculate a first hash fingerprint value separately for each data block in the first data block group, where the first hash fingerprint value includes a first MD5 value and a first Alder32 value.

Step 300: Chunk, based on the sliding window approach, CAD engineering data to be backed up, to determine a second data block group.

Step 400: Calculate a second hash fingerprint value separately for each data block in the second data block group, where the second hash fingerprint value includes a second MD5 value and a second Alder32 value.

Step 500: Determine a backup status of the data block in the second data block group based on the first hash fingerprint value and the second hash fingerprint value, where the backup status of the data block in the second data block group includes performing a backup on the data block in the second data block group and performing no backup on the data block in the second data block group.

Specifically, step 100 specifically includes:

Step 1001: Determine a width w of a sliding window based on an idea of content-defined chunking. The width w of the sliding window is determined based on a storage structure of CAD engineering data.

For computer storage, a file is not a whole, but a bunch of data packets that can be artificially and logically divided. A CAD engineering data file has two core classes: class A and class B. Class A records a specific parameter of a generated feature, and defines purely geometric elements that make up a model (points, curves, and surfaces, and the like.) Class A describes geometric information such as a location, and an equation. There is no spatial or topological relationship between these elements. Class B records a topological relationship of features contained under an entity and describes a connection relationship between the features.

A simple two-dimensional diagram file is used as an example. The graphics are composed of basic graphic elements such as straight lines and circles. A straight line is uniquely defined by the two endpoints and the "line" relationship between them. The straight line in the file can be stored as two endpoint coordinates, that is, stored as four short values, plus one byte to describe the topological relationship "straight line", which may be noted as "L". Thus, a straight line is stored as 9 bytes. When reading "L" from a disk file, a computer divides 9 bytes as a packet. Similarly, a circle can be represented by its center coordinates and radius, which is written as "R". When reading "R" from a disk file, the computer divides 7 bytes as a packet. After the above process, an engineering data file is divided into packets based on a file type. It should be noted that a same packet size for different topological relationships does not affect a subsequent operation. Following this approach, it is also possible to construct three-dimensional graphic files using 3D voxels.

S1002: Traverse the historical CAD engineering data through the sliding window of the width w, and calculate a plurality of first fingerprint values, where the first fingerprint value is a fingerprint value of the historical CAD engineering data corresponding to each sliding window. To ensure efficiency, a weak hash fingerprint value, such as an Alder32 value, is used.

Step 1003: When the first fingerprint value satisfies a first setting condition, determine the historical CAD engineering data corresponding to the first fingerprint value as a first data block, where the first setting condition is f mod D=r, f is the first fingerprint value, D and r are both predetermined values, and r<D.

When the first fingerprint value does not meet the first setting condition, continue sliding the window and recalculate the fingerprint value, and so on to an end of the file.

Step 1004: Determine a plurality of first data blocks as the first data block group.

Preferably, MD5 can convert a string of any length to a 128-bit fixed-length string, and determine whether a data block is modified by comparing MD5 values of data blocks. If the MD5 values are not equal to each other, it is determined that this file block is modified. In addition, the MD5 values have a low collision rate, but generation of the MD5 values takes a relatively long CPU time, so Alder32 verification is chosen, which is a more general solution. Alder32 is fast to calculate and costs less, but has a disadvantage of having a higher collision rate than MD5.

Specifically, in this embodiment, the MD5 value and Alder32 verification are combined, and the step 500 specifically includes:

Step S001: Determine whether the first Alder32 value is equal to the second Alder32 value, to obtain a first result.

Step S002: If the first result indicates that the first Alder32 value is not equal to the second Alder32 value, perform a backup on the data block in the second data block group corresponding to the second Alder32 value.

Step S003: If the first result indicates that the first Alder32 value is equal to the second Alder32 value, determine whether the first MD5 value is equal to the second MD5 value, to obtain a second result.

Step S004: If the second result indicates that the first MD5 value is not equal to the second MD5 value, perform a backup on the data block in the second data block group corresponding to the second MD5 value.

Step S005: If the second result indicates that the first MD5 value is equal to the second MD5 value, perform no backup on the data block in the second data block group.

In a specific embodiment, a server chunks, based on a sliding window of a width w1, a latest file starting from zero byte, calculates an Alder32 value for each data block, and then checks and compares the Alder32 value with an Alder32 value of a data block in an original storage file. If the Alder32 values are not equal to each other, there is no doubt that file content is different and a storage backup of the data block is required. Then, the server chunks the latest file with a sliding window of a width w2 starting from zero byte, and calculates an Alder32 value for each block again, and compares the Alder32 value with an Alder32 value of a data block in the original storage file. The cycle continues until some Alder32 value is the same, then am MD5 value of a data block with the same Alder32 value is calculated (or obtained directly) and compared with an MD5 value of a corresponding data block in the original storage file. If different, continue to move forward by the data size occupied by one packet and continue to compare Alder32 values and MD5 values; if the same, consider that the data block is not modified and does not need to be stored until all data in the latest file is processed.

Embodiment 2

Figure 2:
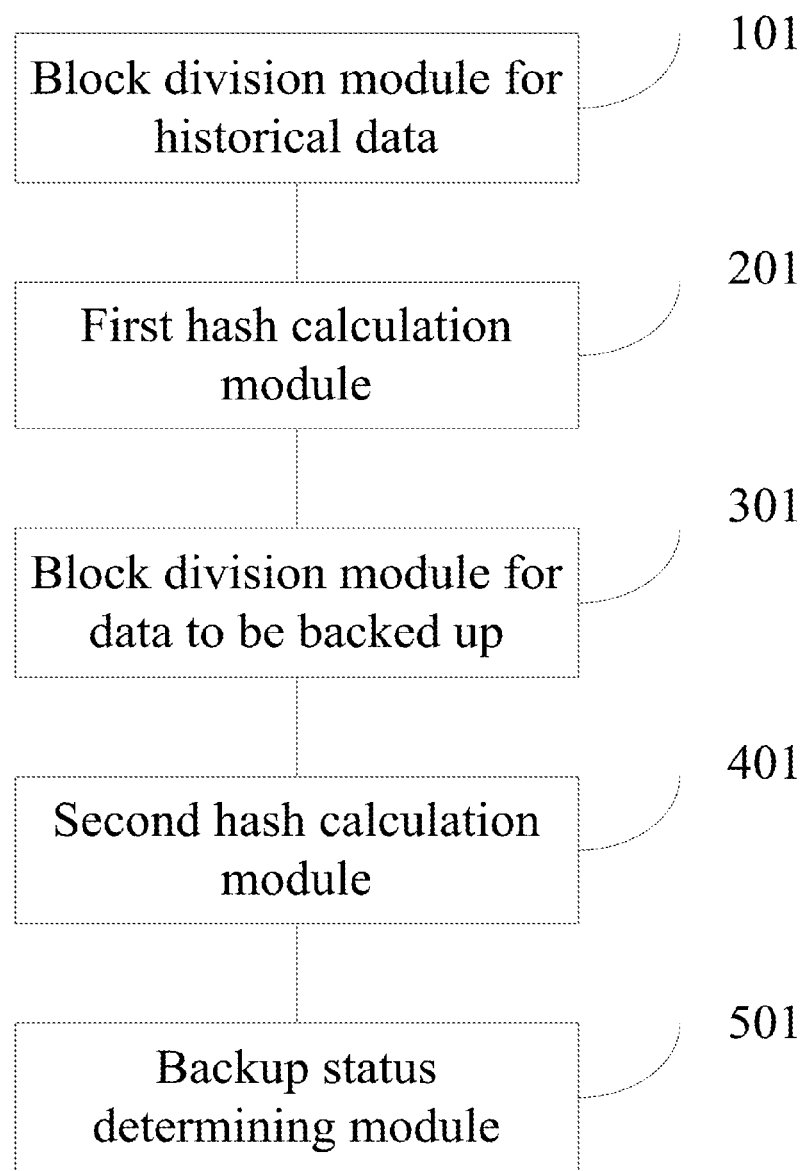
FIG. 2 is a schematic diagram of an architecture of an incremental backup system for a CAD engineering data file according to the present disclosure.

As shown in FIG. 2, an embodiment provides an incremental backup system for a CAD engineering data file, including:

a block division module 101 for historical data, configured to chunk historical CAD engineering data based on a sliding window approach, to determine a first data block group;

a first hash calculation module 201, configured to calculate a first hash fingerprint value separately for each data block in the first data block group, where the first hash fingerprint value includes a first MD5 value and a first Alder32 value;

a block division module 301 for data to be backed up, configured to chunk, based on content-defined chunking, CAD engineering data to be backed up, to determine a second data block group;

a second hash calculation module 401, configured to calculate a second hash fingerprint value separately for each data block in the second data block group, where the second hash fingerprint value includes a second MD5 value and a second Alder32 value; and a backup status determining module 501, configured to determine a backup status of the data block in the second data block group based on the first hash fingerprint value and the second hash fingerprint value, where the backup status of the data block in the second data block group comprises performing a backup on the data block in the second data block group and performing no backup on the data block in the second data block group.

The block division module 101 for historical data specifically includes:

a sliding window determining submodule, configured to determine a width w of a sliding window based on an idea of content-defined chunking;

a fingerprint value calculation submodule, configured to: traverse the historical CAD engineering data through the sliding window of the width w, and calculate a plurality of first fingerprint values, where the first fingerprint value is a fingerprint value of the historical CAD engineering data corresponding to each sliding window;

a block division submodule, configured to: when the first fingerprint value satisfies a first setting condition, determine the historical CAD engineering data corresponding to the first fingerprint value as a first data block, where the first setting condition is f mod D=r, f is the first fingerprint value, D and r are both predetermined values, and r<D; and a data group submodule, configured to determine a plurality of first data blocks as the first data block group.

Optionally, the backup status determining module 501 specifically includes:

a first determining submodule, configured to determine whether the first Alder32 value is equal to the second Alder32 value, to obtain a first result;

a first backup submodule, configured to: when the first result indicates that the first Alder32 value is not equal to the second Alder32 value, perform a backup on the data block in the second data block group corresponding to the second Alder32 value;

a second determining submodule, configured to: when the first result indicates that the first Alder32 value is equal to the second Alder32 value, determine whether the first MD5 value is equal to the second MD5 value, to obtain a second result;

a second backup submodule, configured to: when the second result indicates that the first MD5 value is not equal to the second MD5 value, perform a backup on the data block in the second data block group corresponding to the second MD5 value; and a third backup submodule, configured to: when the second result indicates that the first MD5 value is equal to the second MD5 value, perform no backup on the data block in the second data block group.

The sliding window determining submodule further includes:

a window width setting unit, configured to determine the width w of the sliding window based on a storage structure of CAD engineering data.

Each embodiment of the present specification is described in a progressive manner, each embodiment focuses on the difference from other embodiments, and the same and similar parts between the embodiments may refer to each other.

Specific examples are used herein to explain the principles and embodiments of the present disclosure. The foregoing description of the embodiments is merely intended to help understand the method of the present disclosure and its core ideas; besides, various modifications may be made by those of ordinary skill in the art to specific embodiments and the scope of application in accordance with the ideas of the present disclosure. In conclusion, the content of the present specification shall not be construed as limitations to the present disclosure.

The invention claimed is:

1. An incremental backup method for a computer aided design (CAD) engineering data file, wherein the incremental backup method for a CAD engineering data file comprises:

chunking historical CAD engineering data based on a sliding window approach, to determine a first data block group;

calculating a first hash fingerprint value separately for each data block in the first data block group, wherein the first hash fingerprint value comprises a first MD5 value and a first Alder32 value;

chunking, based on the sliding window approach, CAD engineering data to be backed up, to determine a second data block group;

calculating a second hash fingerprint value separately for each data block in the second data block group, wherein the second hash fingerprint value comprises a second MD5 value and a second Alder32 value; and determining a backup instruction of the data block in the second data block group based on the first hash fingerprint value and the second hash fingerprint value, wherein the backup instruction of the data block in the second data block group comprises performing a backup on the data block in the second data block group or performing no backup on the data block in the second data block group based on a result comparison of hash values;

wherein the chunking historical CAD engineering data based on a sliding window approach, to determine a first data block group specifically comprises:

determining a width w of a sliding window based on an idea of content-defined chunking;

wherein the width w of the sliding window is determined based on a storage structure of CAD engineering data.

2. The incremental backup method for a CAD engineering data file according to claim 1, wherein the chunking historical CAD engineering data based on a sliding window approach, to determine a first data block group specifically further comprises:

traversing the historical CAD engineering data through the sliding window of the width w, and calculating a plurality of first fingerprint values, wherein the first fingerprint value is a fingerprint value of the historical CAD engineering data corresponding to each sliding window;

when the first fingerprint value satisfies a first setting condition, determining the historical CAD engineering data corresponding to the first fingerprint value as a first data block, wherein the first setting condition is f mod D=r, f is the first fingerprint value, D and r are both predetermined values, and r<D; and determining a plurality of first data blocks as the first data block group.

3. The incremental backup method for a CAD engineering data file according to claim 1, wherein the determining a backup instruction of the data block in the second data block group based on the first hash fingerprint value and the second hash fingerprint value specifically comprises:

determining whether the first Alder32 value is equal to the second Alder32 value, to obtain a first result;

if the first result indicates that the first Alder32 value is not equal to the second Alder32 value, performing a backup on the data block in the second data block group corresponding to the second Alder32 value;

if the first result indicates that the first Alder32 value is equal to the second Alder32 value, determining whether the first MD5 value is equal to the second MD5 value, to obtain a second result;

if the second result indicates that the first MD5 value is not equal to the second MD5 value, performing a backup on the data block in the second data block group corresponding to the second MD5 value; and if the second result indicates that the first MD5 value is equal to the second MD5 value, performing no backup on the data block in the second data block group.

* * * * *